United States Patent
Ulriksson

(10) Patent No.: US 11,929,761 B1
(45) Date of Patent: Mar. 12, 2024

(54) LOW LATENCY DECODER

(71) Applicant: Seagate Technology LLC, Fremont, CA (US)

(72) Inventor: Bengt Anders Ulriksson, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/938,854

(22) Filed: Oct. 7, 2022

(51) Int. Cl.
*H03M 13/00* (2006.01)
*H03M 13/11* (2006.01)

(52) U.S. Cl.
CPC .... *H03M 13/1131* (2013.01); *H03M 13/1125* (2013.01); *H03M 13/6577* (2013.01)

(58) Field of Classification Search
CPC ......... H03M 13/1131; H03M 13/6577; H03M 13/1125
See application file for complete search history.

(56) References Cited

U.S. PATENT DOCUMENTS

| | | | |
|---|---|---|---|
| 8,504,887 B1 | 8/2013 | Varnica et al. | |
| 8,984,365 B1 | 3/2015 | Norrie | |
| 9,015,547 B2 | 4/2015 | Wang et al. | |
| 9,141,467 B2 | 9/2015 | Kim et al. | |
| 9,176,814 B2 | 11/2015 | Cherubini et al. | |
| 9,337,865 B2 | 5/2016 | Cohen et al. | |
| 2005/0283707 A1* | 12/2005 | Sharon | H03M 13/635 714/758 |
| 2008/0320363 A1* | 12/2008 | He | H03M 7/30 714/E11.032 |
| 2013/0346833 A1* | 12/2013 | Kwok | H03M 13/09 714/781 |
| 2015/0236726 A1 | 8/2015 | Sankaranarayanan et al. | |
| 2020/0373943 A1 | 11/2020 | Cho et al. | |

FOREIGN PATENT DOCUMENTS

CN 104579362 B 10/2017

\* cited by examiner

*Primary Examiner* — Samir W Rizk
(74) *Attorney, Agent, or Firm* — Christian W. Best

(57) ABSTRACT

Systems and methods are disclosed for implementing a low latency decoder. In certain embodiments, an apparatus may comprise decoder configured decode a codeword of bits, including: a variable node processor configured to provide a plurality of variable-to-check (v2c) message vectors to the edge combiner in parallel, the plurality of v2c message vectors including estimates for a selected set of bits of the codeword; the edge combiner configured to generate a plurality of output message vectors for a plurality of check node vectors based on the plurality of v2c message vectors, and provide the plurality of output message vectors to the plurality of check node vectors simultaneously; a check node processor configured to update the plurality of check node vectors based on the plurality of output message vectors; and a convergence checker circuit configured to detect a valid code word based on bit value estimates from the variable node processor.

20 Claims, 9 Drawing Sheets

LOW LATENCY DECODER

SUMMARY

In certain embodiments, an apparatus may comprise a low density parity check (LDPC) decoder configured decode a codeword of bits, including a variable node processor, an edge combiner, a check node processor, and a convergence checker circuit. The variable node processor may be configured to provide a plurality of variable-to-check (v2c) message vectors to the edge combiner in parallel, the plurality of v2c message vectors including estimates for a selected set of bits of the codeword. The edge combiner may be configured to generate a plurality of output message vectors for a plurality of check node vectors based on the plurality of v2c message vectors, and provide the plurality of output message vectors to the plurality of check node vectors simultaneously. The check node processor may be configured to update the plurality of check node vectors based on the plurality of output message vectors, and the convergence checker circuit may be configured to detect a valid code word based on bit value estimates from the variable node processor.

In certain embodiments, a method may comprise implementing a low density parity check (LDPC) decoder configured decode a codeword of bits, including: providing a plurality of variable-to-check (v2c) message vectors from a variable node processor to an edge combiner in parallel, the plurality of v2c message vectors including estimates for a selected set of bits of the codeword; generating, at the edge combiner, a plurality of output message vectors for a plurality of check node vectors based on the first plurality of v2c message vectors; providing the plurality of output message vectors from the edge combiner to the plurality of check node vectors simultaneously; updating the plurality of check node vectors at a check node processor based on the plurality of output message vectors; and detecting a valid code word at a convergence checker circuit based on bit value estimates from the variable node processor.

In certain embodiments, a memory device may store instructions that, when executed, cause a processor to perform a method comprising implementing a low density parity check (LDPC) decoder configured to decode a codeword of bits, including: providing a plurality of variable-to-check (v2c) message vectors from a variable node processor to an edge combiner in parallel, the plurality of v2c message vectors including estimates for a selected set of bits of the codeword; generating, at the edge combiner, a plurality of output message vectors for a plurality of check node vectors based on the first plurality of v2c message vectors; providing the plurality of output message vectors from the edge combiner to the plurality of check node vectors simultaneously; updating the plurality of check node vectors at a check node processor based on the plurality of output message vectors; and detecting a valid code word at a convergence checker circuit based on bit value estimates from the variable node processor.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules or nodes, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
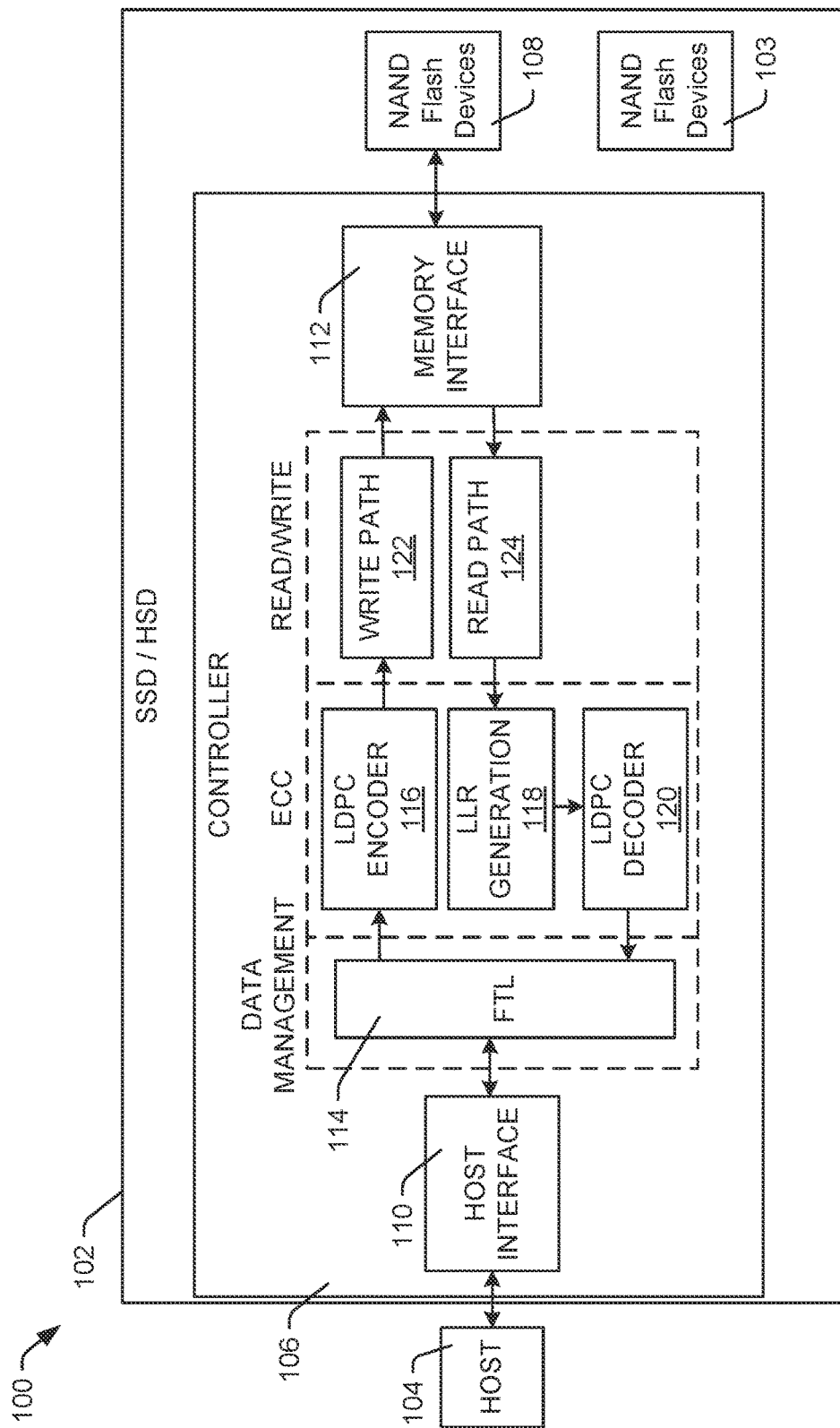
FIG. 1 is a diagram of a system configured to implement a low latency decoder, in accordance with certain embodiments of the present disclosure.

FIG. 1 is a diagram of a system 100 configured to implement a low latency decoder, in accordance with certain embodiments of the present disclosure. Although the systems and methods of decoding described herein can be applied to any appropriate data transmission and decoding process, examples will be provided herein of applying the decoding to data storage and retrieval. Specifically, FIG. 1 provides a functional block diagram of an example data storage device (DSD) 102 and host 104. The DSD 102 may be a solid state data storage device (SSD) or a hybrid data storage device (HSD) or any other type of data storage device for which the present systems and processes may be beneficial.

The DSD 102 can include one or more data storage mediums, such as one or more solid state memories 108, for example NAND flash memory. The DSD 102 may include one or more additional memories 103 instead of or in addition to flash memory 108. For example, additional memory 103 can be either volatile memory such as DRAM or SRAM, disc-based nonvolatile memories such as magnetic hard discs, other types of memory, or a combination thereof. The additional memory 103 can function as a working memory for software or firmware, storing generated parity data, a cache to store recently or frequently read or written data, or data likely to be read soon, or for other temporary data storage. Additional memory 103 may also function as main long-term storage instead of or in addition to flash memory 108. A DSD 102 containing multiple types of nonvolatile storage mediums, such as a disc(s) and flash, may be referred to as a hybrid storage device.

The DSD 102 can communicate with a host device 104 via a hardware and firmware-based interface circuit 110. The interface 104 may comprise any interface that allows communication between the host 104 and the DSD 102, via either wired or wireless connection, such as Universal Serial Bus (USB), IEEE 1394 (Institute of Electrical and Electronics Engineers standard 1394), Compact Flash, Serial AT Attachment (SATA), external SATA (eSATA), Parallel ATA (PATA), Small Computer System Interface (SCSI), Serial Attached SCSI (SAS), Peripheral Component Interconnect Express (PCIe), Fibre Channel, Ethernet, or Thunderbolt, among others. The host interface 110 may include a connector (not shown) that allows the DSD 102 to be physically removed from the host 104. In some embodiments, the DSD 102 may have a casing or housing containing the components of the DSD 102, or the components of the DSD 102 may be attached to the housing, or a combination thereof.

The DSD 102 can include a programmable controller 106, which can include various circuits, modules, and functions that allow the controller to perform data management, error correcting code (ECC), and read/write processes. The controller 106 may also include a memory interface 112 that allows data to be stored to and read from the solid state memory 108. The controller 106 may also include a flash translation layer (FTL) 114 to map sectors and pages from logical addresses to physical addresses, which may be implemented via tables.

The controller 106 may also perform data detection and associated error correction via utilizing error correcting code (ECC), which may be implemented via one or more circuits, firmware, or a combination thereof. The error correction may include a low density parity check (LDPC) encoder 116, a log-likelihood ratio (LLR) generator 118, and a LDPC decoder 120. The LDPC encoder 116 can encode data bits based on a specific LDPC code to store data at the solid state memory 108 via a write path 122 and the memory interface 112. LDPC codes may vary based on SSD endurance requirements or other memory design requirements. The LDPC decoder 120 can decode data from the solid state memory 108 based on the LDPC code of the encoder 116; the LDPC decoder may receive soft information as an input from the LLR generator 118 which can determine the information based on bits received from the read path 124.

The LLR generator 118 can provide a soft estimation for the data bits of the memory cells of a memory sector of the memory 108. The LLR generation module 118 can provide the information in the form of log-likelihood ratios (LLRs), which may provide a probability of each data bit being 0 or 1. The LLRs may be indicative of a confidence in zero ("0") or one ("1") for each data bit read from the memory 108. Generally, a sign of the LLR can provide an estimation of the data bit, and a magnitude of the LLR can provide a reliability of the estimation. For example, the larger a positive LLR value is, the stronger the confidence that a bit is a "0"; the larger a negative LLR value is, the stronger the confidence that a bit is a "1" (or vice-versa, depending on implementation); and the lower the value, the greater the uncertainty.

As an example, during re-reads of solid state memories like NAND flash 108, the DSD 102 may apply a variety of different read voltage thresholds, and can evaluate how the read bit values change using the different thresholds. This can generate "soft" information which can provide additional insights into which bits are most reliable. For example, if adjusting the read thresholds up and down produces no change in a given bit value, then the bit is likely to be stable and correct. If adjusting the read threshold changes the bit value, then the bit value may be less "reliable". The additional soft information can be used with LLR lookup tables (LUTs) or algorithms to assign different LLRs to the 0 and 1 bit estimates. Based on the estimated LLRs for the data bits, the decoder module 120 can decode the data.

As performing multiple reads at different thresholds to obtain "true" soft data can be time-consuming, in some embodiments performing multiple reads may be reserved for performing error recovery when an initial read attempt fails. Accordingly, an initial decode attempt may be based on mapping '0' bits to a +7 LLR value and '1' bits to −7 (or some other selected default values), which can then be passed to the LDPC decoder 120. The performance with "hard" LLR values (e.g., pre-selected default values) may be good enough to successfully decode most code words.

An LDPC code word can consist of both user and parity data. Parity data may be calculated by encoder 116 such that a large number of parity sums are satisfied, e.g., sums of bits modulus 2 are either 0 (even parity) or 1 (odd parity). The decoder 120 can correct errors in a corrupted code word until all parity sums are satisfied, for example based on identifying the least reliable bits from the LLR values.

Competitive data storage devices may require very high data rates, and accordingly the speed of the decoder 120 can greatly affect a drive's performance. Improving decoder performance at the cost of high power consumption or complexity can have disadvantages in cost, battery life, component size, or other considerations. Accordingly, providing a low latency decoder with low complexity and high parallelism to improve performance and minimize power requirements can improve data detection operations and systems. The functioning of example LDPC decoders is illustrated in the following figures.

Figure 2:
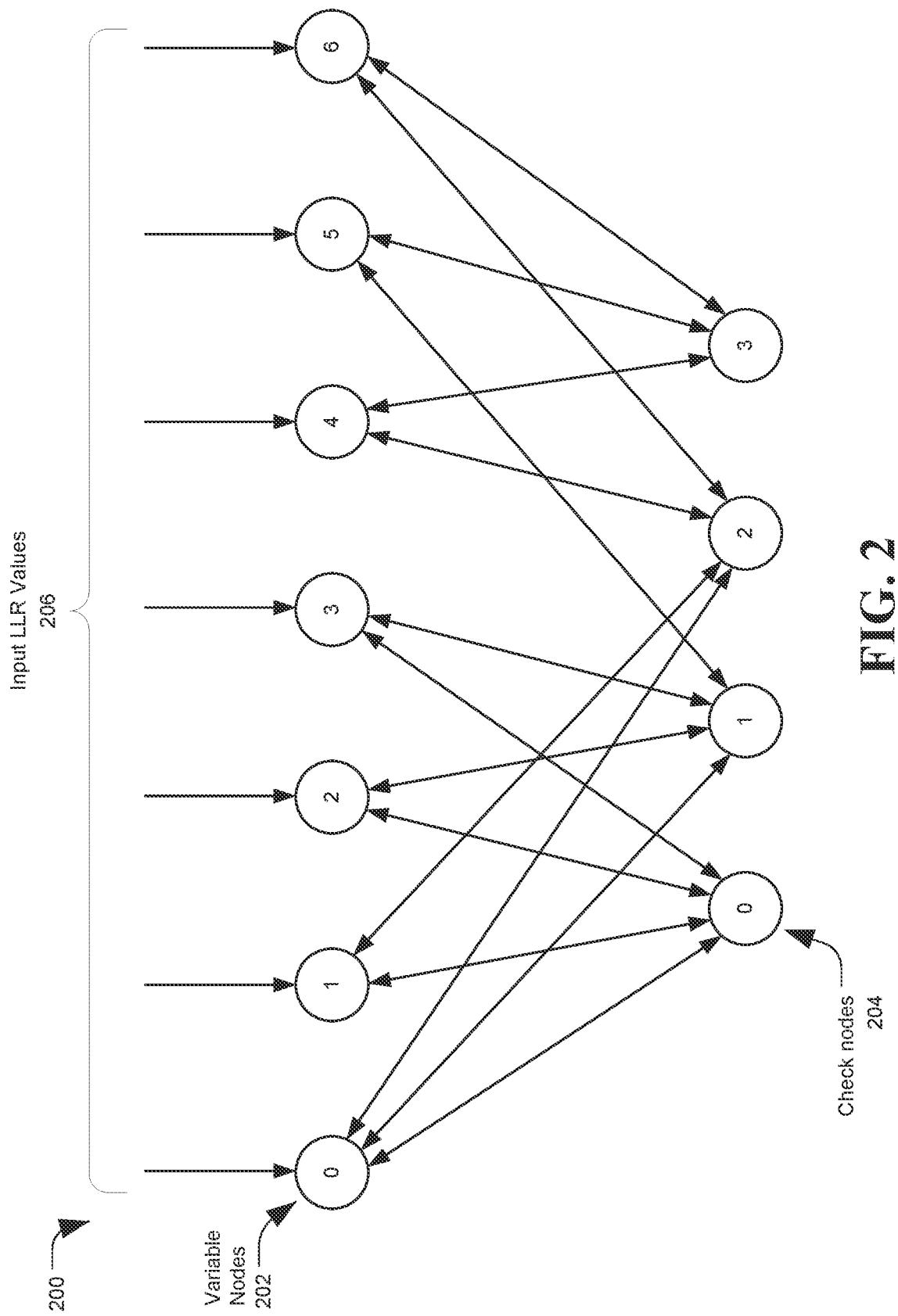
FIG. 2 is a diagram of a system configured to implement a low latency decoder, in accordance with certain embodiments of the present disclosure.

FIG. 2 is a diagram of a system 200 configured to implement a low latency decoder, in accordance with certain embodiments of the present disclosure. In particular, FIG. 2 depicts an example Tanner graph for low density parity check (LDPC) code. The graph may include a plurality of variable nodes 202 (labeled 0 to 6), sometimes called v-nodes, connected to a plurality of check nodes 204 (labeled 0 to 3), sometimes called c-nodes, constraints, or constraint nodes. The variable nodes 202 may receive input LLR values 206 for an LDPC code word, for example from an LLR generation module 118 of FIG. 1. The number of v-nodes 202 may correspond to the length (e.g., number of bits) of a code word to be decoded. Meanwhile, the number of c-nodes 204 may correspond to how many "constraints" or "parity sums" are being used to detect or correct errors in a code word, as explained below.

A soft, iterative LDPC decoder can provide a very good compromise between complexity and performance. A soft decoder uses reliability information to improve performance, for example in the form of log-likelihood ratios (LLRs). An iterative decoder can exchange soft information between variable nodes 202 and check nodes 204 using a number of iterations until convergence, where all parity sums are satisfied. Reducing a required number of iterations, increasing an amount of data exchanged during an iteration, and increasing the code word size are potential ways of improving decoder performance. FIG. 2 shows a Tanner Graph which provides an illustration of the connections between variable nodes 202 and check nodes 204.

The LLR values 206 for an LDPC code word may be populated into the variable nodes 202. LLR values may be provided from variable nodes 202 to check nodes 204 along the connecting arrows. Each check node 204 can estimate the value and reliability of a given bit from the information about all other bits that participate in a given parity sum. The estimated bit values for each bit received by a given check node 204 should sum, modulo two, to zero for the parity sum to be considered valid. That is, in an even parity system, all values connecting to a check node 204 should sum to an even number; or there must be an even number of odd values. Each check node 204 for an LDPC code word may need to output a 0 parity sum value for the code word to be considered successfully decoded. If each bit is represented by a log-likelihood ratio, then the log-likelihood ratio of a given bit can be calculated by the belief propagation expression:

$$c2v_i = 2\tanh^{-1}\left(\prod_{\substack{0 \leq k < n \\ k \neq i}} \tanh(v2c_k/2)\right) \quad (1)$$

where $v2c_k$ (variable-to-check) are messages sent from variable node 202 to check node 204, and $c2v_k$ (check-to-variable) are messages sent from check node 204 to variable node 202, both expressed as log-likelihood ratios.

Equation 1 may not be used in a practical decoder due to both complexity and sensitivity to rounding errors. Instead, the min-sum approximation may commonly be used in practical check nodes:

$$\text{sign}(c2v_i) = \sum_{\substack{0 \leq k < n \\ k \neq i}} \text{sign}(v2c_k) \bmod 2 \quad (2)$$

$$|c2v_i| = \min_{\substack{0 \leq k < n \\ k \neq i}} (|v2c_k|) \quad (3)$$

where sign(x) is 1 if x<0, 0 otherwise. The check node 204 can retain a state which enables it to calculate c2v messages for all bits involved in a particular parity sum. The state may consist of the total sign sum (sum of all signs of incoming messages modulus 2), $min_1$ (the magnitude of the least reliable input message), $eix_1$ (the edge index of the least reliable message) and $min_2$ (the magnitude of the second least reliable message) and finally, a sign memory containing the sign information for all incoming v2c messages.

The variable node 202 may combine all available information about a given bit in the code word. This includes the input log-likelihood ratio 206 provided by a detector or LLR generation module, and messages from all check nodes 204 in which a given bit is involved. On an initial iteration, the information from a check node 204 may be a null value or another nonce value that does not influence the estimate of the bit's value. As the total information combined at the variable node 202 may be represented by LLRs, the total information (sometimes called posterior information) can be given by a simple sum:

$$\text{Posterior}_i = LLR_i^{in} + \sum_{0 \leq k < n} c2v_k \quad (4)$$

The decoder decision can be determined based on the sign bit of the posterior information.

The return message from the variable node 202 to the check node 204 can be found by a similar expression:

$$v2c_j = LLR_i^{in} + \sum_{\substack{0 \leq k < n \\ k \neq j}} c2v_k \quad (5)$$

Figure 3:
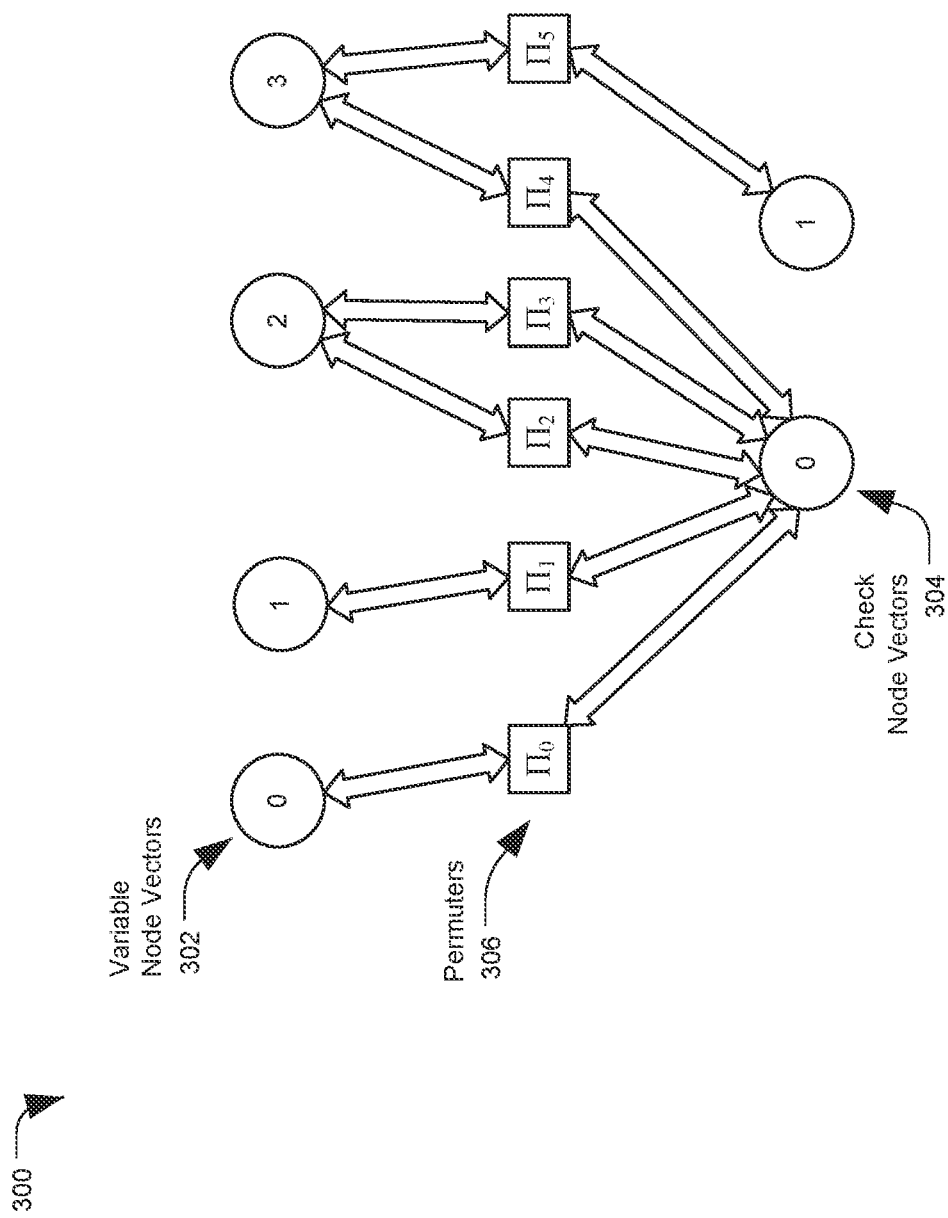
FIG. 3 is a diagram of a system configured to implement a low latency decoder, in accordance with certain embodiments of the present disclosure.

Turning now to FIG. 3, a diagram of a system 300 configured to implement a low latency decoder is shown, in accordance with certain embodiments of the present disclosure. In particular, FIG. 3 depicts an example simplified vector Tanner graph, similar to Tanner graph depicted in FIG. 2.

LDPC detector graphs may be designed such that edges can be processed in parallel using a vector processor. In practical implementation of a decoder, large code words with thousands of bits, such as 32K bits, may be decoded. So having 32K individual variable nodes connected to potentially hundreds or thousands of check nodes would result in huge complexity in the decoder. Instead, the variable nodes and check nodes may be grouped into vectors, where a node vector may handle, e.g., 512 bits, so that a 32K-bit code word could be handled via 64 v-node vectors. Accordingly, system 300 may include a plurality of variable nodes vectors 302 (labeled 0 to 3), connected to a plurality of check nodes vectors 304 (labeled 0 to 1).

The node vectors may exchange message vectors to handle the large number of bits in parallel. In node vector embodiments, the v2c and c2v messages sent between the node vectors may be message vectors, each providing LLR values for a plurality of bits of a variable node vector or check node vector. For example, rather than exchanging messages about individual bits between nodes, vector messages can be exchanged between check node vectors 304 and variable node vectors 302 that correspond to "Z" bits of the code word (e.g., 512 bits). Each message vector may have Z individual messages corresponding to the Z code word bits. In a "soft" decoder implementation, the individual message components for each bit of the code word may be represented by an LLR value, where the sign bit is an estimate of the bit decision and the magnitude indicates the reliability of that estimate. The LLR bit representation may be used for both the input symbols and the information ("messages") passed between the check nodes 304 and the variable nodes 302. The sign memory 504, the decision memory 526, and the convergence checker 528, all discussed later in regard to FIGS. 5 and 7, may be the only parts of the example decoder that only use bits rather than LLR values.

In the vector implementation, it may be advantageous to have "randomness" or change in the LLR message vectors, by adjusting the position of the individual messages within a message vector. To implement this, the variable and check node vectors may be interconnected through programmable permuters 306, such that a sufficiently "random" or cyclic permutations of the bus connecting the node vectors can be obtained. Each permuter 306 located between the check and variable nodes may process the 512 individual messages of a message vector.

If each bit of a message vector has a corresponding message, all messages may be passed on, but the order of the messages within the vector can be changed in the permuter 306. For example, a cyclic permuter 306 may shift the messages by i positions, where i is programmable, such that input message 0 becomes output message i, input 1 becomes output i+1, . . . , input message 511 becomes output message i−1, etc. A permuter 306 may be implemented as layers of switches which can shift messages by $2^i$ positions (where i may be the layer index) if the layer is activated (if not activated, then the messages may be passed through without a shift). So for example if the variable node vectors 302 and check node vectors 304 represent, e.g., 512 bits each, the first layer can shift message 0 to 1, message 1 to 2, . . . , message 511 to 0. The second layer can shift message 0 to 2, message 1 to 3, . . . , message 511 to 1. Note that this is not the only way a permuter 306 can be implemented; other example embodiments may use a different scheme. The permutations may be different for v2c and c2v messages. If the $v2c_i$ message vector uses permutation $\pi_i$ then the $c2v_i$ message vector may use permutation $\pi_i^{-1}$, where the inverse permutation is defined by $\pi_i^{-1} \cdot \pi_i = I$, where I is the identity permutation. Permuters 306, as well as the connections between v-node vectors and c-node vectors (e.g., which nodes are connected), may be programmable, for example via a microcode. Therefore, the edges or connections between node vectors, and the permutations within the connections, can be different depending on the programed microcode or other instructions. In some examples, the permutations of the permuters 306 can be selected based on optimization testing performed during a design process for a system, and then stored as microcode for execution during device operation.

FIG. 3 also includes a multi-edge connection between variable node vector 2 and check node vector 0. A multi-edge connection may refer to several edges connecting a given variable node to a given check node. Supporting such multi-edges may be important when using large parallelism for high performance decoders, as the number of check node vectors may be small in such configurations.

Another important consideration in allowing multi-edges in the graph may be the efficiency of the LDPC encoder algorithm. The encoder can solve a linear equation system in the binary field. An efficient algorithm may be obtained by including as many rows as possible in an upper triangular matrix. Equation 6 shows a hypothetical parity check matrix suitable for a decoder that does not support multi-edge connections. Each entry in the matrix may represent a Z by Z matrix. Multiplication of this matrix and a bit vector can permute the bit vector in the same manner as the permutations shown in the Tanner graph. The upper triangular submatrix may not include the 3 last rows of the matrix, requiring substantial effort in the encoder.

$$\begin{matrix} \prod_{00} & \prod_{01} & \prod_{02} & \prod_{03} & \prod_{04} & \prod_{05} & \cdots \\ & \prod_{11} & \prod_{12} & \prod_{13} & & & \cdots \\ & & \ddots & & & \vdots & \\ \prod_{m-3,0} & \prod_{m-3,1} & & \prod_{m-3,3} & \prod_{m-3,4} & \prod_{m-3,5} & \cdots \\ \prod_{m-2,0} & & \prod_{m-2,2} & \prod_{m-2,3} & \prod_{m-2,4} & \prod_{m-2,5} & \cdots \\ \prod_{m-1,0} & \prod_{m-1,1} & \prod_{m-1,2} & & \prod_{m-1,4} & \prod_{m-1,5} & \cdots \end{matrix} \quad (6)$$

Equation 7 shows a hypothetical parity check matrix with degree-4 variable nodes for a decoder which supports multi-edge connections. In this case, there is only one row outside the upper triangular submatrix. An equation involving this parity check matrix can be solved with much less effort than the matrix shown in equation 6.

$$\begin{matrix} \prod_{00} & \prod_{01}^a + \prod_{01}^b & \prod_{02} & \prod_{03} & \prod_{04} & \prod_{05} & \cdots \\ & \prod_{11} & \prod_{12} & \prod_{13} & \prod_{14} & \prod_{15} & \cdots \\ & & \prod_{22} & \prod_{23} & \prod_{24} & & \cdots \\ & & & \prod_{33} & & \prod_{35} & \cdots \\ & & & & \ddots & \vdots & \\ \prod_{m-1,0}^a + \prod_{m-1,0}^b + \prod_{m-1,0}^c & \prod_{m-1,1} & \prod_{m-1,2} & & \prod_{m-1,4} & \prod_{m-1,5} & \cdots \end{matrix} \quad (7)$$

A major difference between LDPC decoders can involve the scheduling of edges, which may refer to the order in which edges between nodes or node vectors are processed during an iteration. The selection of a specific schedule may be highly dependent on the type of channel or decoder used in a given system. Some example decoder types may include flooding decoders and layered decoders.

A flooding decoder may process edges in the variable node (or code word) order. Referring to FIG. 2, the edges connecting variable node 0 to check nodes 0, 1, and 2 may be processed first by sending sequential c2v messages from check nodes 0, 1, and 2 to the variable node 0, which calculates the posterior information and v2c return messages to the check nodes. The process may then be repeated for each variable node in turn until all edges in the graph 200 have been processed, completing the iteration. The flooding decoder may rely on two copies of the decoder state: the first copy may contain the complete state from the previous iteration, whereas the second copy can be updated with the new state for use during the following iteration. This type of decoder can provide good performance in an ISI (inter-symbol interference) channel such as in disc drives.

A layered decoder may process edges in the check node order, e.g., all edges connected to check node 0 may be processed before starting on check node 1, etc. If the first edge to be processed is the edge from variable node 0 to check node 0, the layered decoding process may include sending c2v messages from all check nodes 204 connected to variable node 0, and sending a return v2c message from variable node 0 to check node 0 to update the first edge. This process may be repeated for each edge of check node 0 (e.g., sending c2v messages to variable nodes 1, then 2, and then 3 to update the edges to check node 0), and then again for check node 1, etc. In a layered decoder, the message loop can be initialized from an input LLR buffer during the processing of a first layer during the first iteration. This decoder can read (unsaturated) v2c messages for layer m from a message memory. c2v messages from layer m may then be added to the v2c m messages, creating posterior information which can be permuted to match the following layer (m+1). A subtractor can use $c2_{vm+1}$ messages from the previous iteration to create new v2 $c_{m+1}$ messages which can be used to update both the message memory and the check node state for layer m+1. Decisions can be obtained from the posterior values after a de-permutation to recover the unpermuted output vectors.

The type of decoder architecture being used can impact whether flooding or layered decoding can be implemented. The flooding decoder may process the whole code word before it updates the state for the next iteration. Whereas a layered decoder can update the state and provide positive feedback to the v-nodes after each check node, potentially enabling a code word to be decoded without a full iteration. The example flooding decoding architecture provided herein enables very low latency by employing high parallelism for both c2v message vectors and v2c message vectors, so that multiple check nodes 304 may be updated together. A high level view is shown in FIG. 4.

Figure 4:
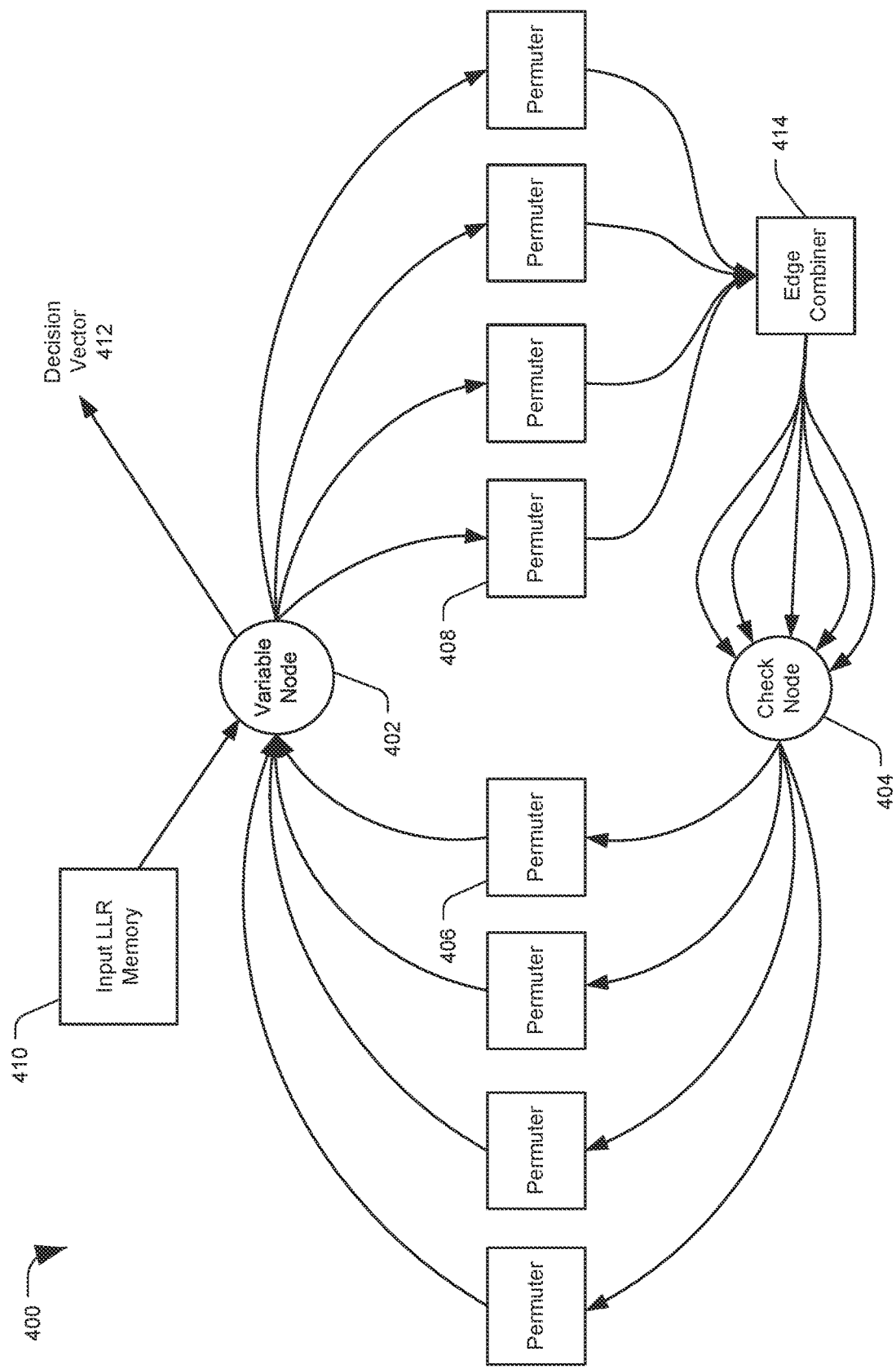
FIG. 4 is a diagram of a system configured to implement a low latency decoder, in accordance with certain embodiments of the present disclosure.

FIG. 4 is a diagram of a system 400 configured to implement a low latency decoder, in accordance with certain embodiments of the present disclosure. In particular, FIG. 4 depicts a decoder 400 which may include a variable node processor 402 and a check node processor 404. The node processors may perform processing for individual nodes as in FIG. 2, for node vectors as in FIG. 3, or for sets or groups of nodes or node vectors, and may sometimes be referred to herein as "variable nodes" or "check nodes" for the sake of simplicity. The decoder 400 may further include permuters 406 and 408, an edge combiner 414, an input LLR memory or other LLR source 410, and the decoder 400 may output a decision vector 412.

The example decoder 400 design of FIG. 4 assumes that most variable nodes 402 have degree 4, e.g., four edges connect the variable node 402 to the check nodes 404. An example sequential flooding decoder implementation, lacking the parallelism of the depicted decoder 400, might use sequential message processing of individual message vectors to update the graph edges, where a degree-4 variable node added one c2v message vector to the input LLR values during the first clock cycle, followed by accumulating the remaining three c2v message vectors during the next three clock cycles to generate posterior information, and then generated v2c messages over four clock cycles by subtracting delayed c2v messages from the posterior information.

Conversely, the example low latency decoder 400 may update four edge vectors per clock cycle. The check node processor 404 may send four c2v message vectors to the variable node processor 402 in parallel (e.g., from four different check nodes), such that the variable node processor 402 can calculate both posterior information and return four v2c message vectors to the check node processor 404 in parallel, thus providing high throughput and low latency. The check node processor 404 may therefore send four c2v messages, and receive four v2c messages, in parallel each clock cycle. The iteration time of the new decoder 400 may thus be reduced to a quarter of the iteration time of a sequential decoder that processes one edge vector per clock cycle. Variable nodes 402 with degrees higher than 4 can be processed by accumulating c2v message vectors over multiple clock cycles. The low latency decoder 400 may be a flooding decoder since multiple check node vectors can be updated at the same time. The check node processor 404 may accumulate v2c message information as each variable node vector is processed, until state information for all the check node vectors can be updated.

Support for multi-edge connections (as described in regard to FIG. 3) may add complexity to the check node vector processor 404, as several v2c messages vectors may be combined before updating the check node state. Accordingly, the edge combiner 414 provides multi-edge functionality for the new decoder 400. In an example embodiment where a state memory for the check node processor 404 has been limited to five check node vectors by design, the edge combiner 414 may generate input values for all five check node vectors from the example four v2c message vectors received from the v2c permuters 408. The edge combiner 414 can also combine several v2c message vectors destined for the same check node vector, such as in the case of a multi-edge connection between a check node vector and variable node vector. If a particular check node vector does not receive a message vector during a given clock cycle, then the edge combiner 414 may generate a "dummy" vector (e.g., 0 value) which does not change the state of the check node vector.

Figure 5:
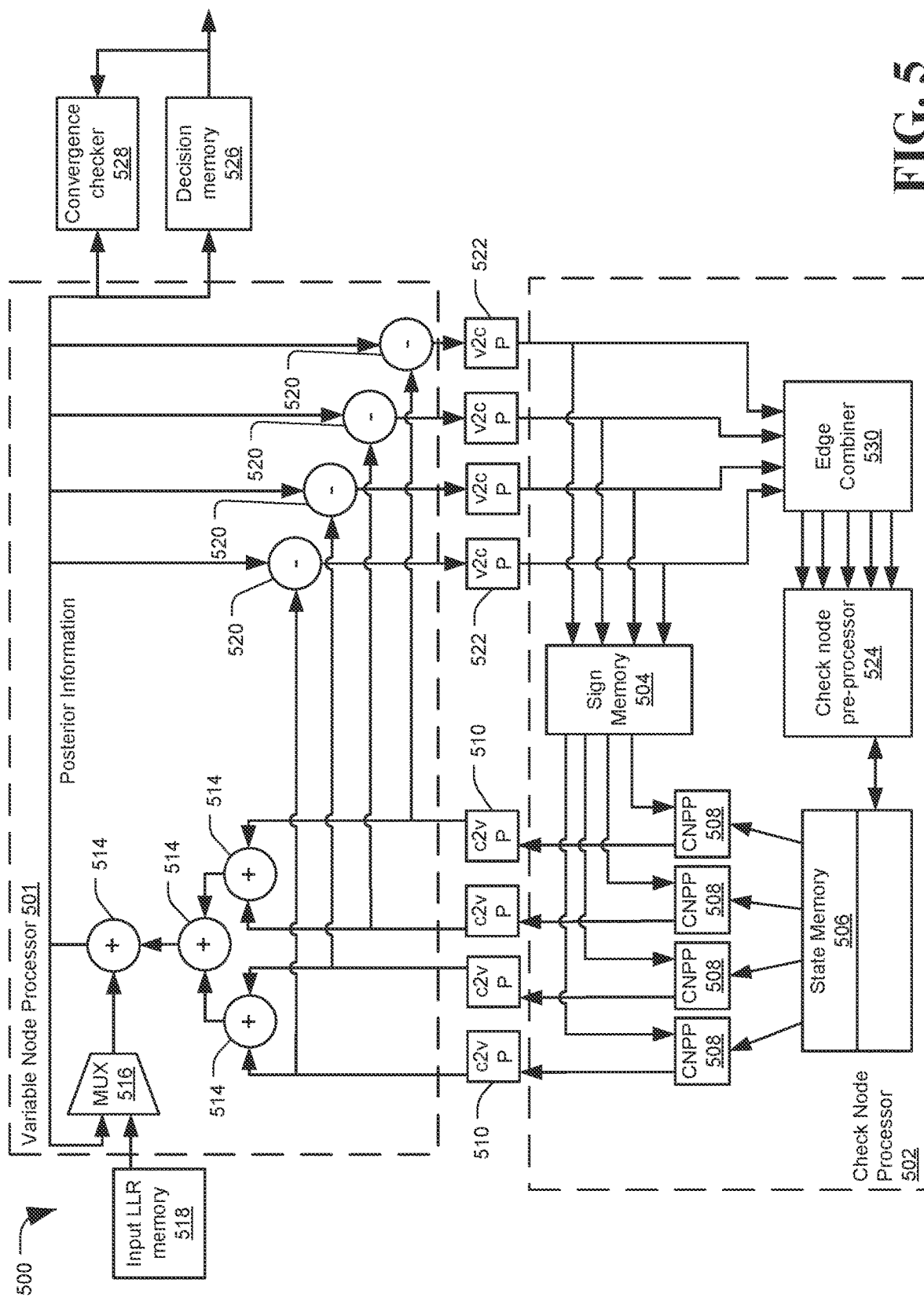
FIG. 5 is a diagram of a system configured to implement a low latency decoder, in accordance with certain embodiments of the present disclosure.

FIG. 5 is a diagram of a system 500 configured to implement a low latency decoder, in accordance with certain embodiments of the present disclosure. In particular, FIG. 5 depicts a more detailed example block diagram architecture of a high parallelism, low latency LDPC decoder than the diagram of decoder 400 of FIG. 4. The decoder 500 may include a check node processor 502 and a variable node processor 501, connected via a plurality of check-to-variable (c2v) permuters and data paths 510, and variable-to-check (v2c) permuters and data paths 522. The decoder 500 may further include an input LLR source or memory 518, a decision memory 526 and a convergence checker 528. The components of system 500 may include circuits, software or microcode, or other modules. The system 500 may be configured to process vectors, such that the various elements can process a vector of, e.g., 512 messages, bits, or LLR values per clock cycle.

The check node processor 502 may include a sign memory 504, a state memory 506, a plurality of check node post processors (CNPP) 508, a check node pre-processor 524, and an edge combiner 530. The variable node processor 501 may include a plurality of adder elements 514, a multiplexor 516, and a plurality of subtractor elements 520.

In an example embodiment of decoder 500, decoding a code word may involve processing a plurality of v-nodes and c-nodes. The number of c-nodes a v-node is connected to in a graph (e.g., the number of edge lines connected to a v-node in a graph such as the Tanner graph of FIG. 2) may indicate the degree of a v-node. The following discussion addresses an example decoder 500 using the assumption that a degree-4 variable node vector is processed at any given time by variable node processor 501. Higher degree variable nodes can be processed by using additional clock cycles, and implications of such higher-degree nodes may be pointed out herein. As an example, v-node 0 may be connected to c-nodes 0, 1, 2, and 3, and is therefore degree 4. Different v-nodes can be processed, and different c-nodes can send messages or be updated, on different iterations at the decoder 500. In a flooding decoder that processes a graph in the variable node order, the system may process each variable node in order by sending c2v messages from every check node that shares an edge with the selected variable node.

For convenience, the parallelism of a vector processor (e.g., a number of bits of the total code word associated with each vector message, such as data for 512 code word bits) may be designated "Z". The components of system 500 may operate by exchanging LLR value representations for each bit, as discussed previously. The sign memory 504, the decision memory 526, and the convergence checker 528, may be the only parts of the example decoder 500 that use bits (e.g., the sign values representing whether a bit is believed to be a "1" or a "0") rather than LLR values.

As an overview, the decoder 500 may be implementing a flooding decoder, which may update a total state of a vector graph by processing edges in the v-node order, e.g., starting with a v-node selected for updating, such as v-node 0. An edge between nodes in a graph may be updated based on a v2c message from a selected v-node to a c-node connected by the edge (e.g., sent via a v2c permuter 522). The variable node processor 501 may process a variable node based on c2v messages received from all check nodes connected to the variable node (e.g., sent via c2v permuters 510). The c2v messages may be generated based on the current check node states (obtained by CNPPs 508 from state memory 506). The variable node processor 501 may use the c2v messages along with the input LLR data from input LLR memory 518 to generate posterior information and provide v2c messages back to the connected check nodes. Once all the v-nodes have been processed, then every edge of the graph may have been updated via the returned v2c messages. The state of the graph may be updated based on the v2c messages (e.g., via edge combiner 530, check node pre-processor 524, and state memory 506), and a next iteration of the decoder may be performed if the code word has not yet converged.

In execution, a variable node may be defined in system 500 based on which check nodes it shares edges with. Accordingly, to "select" a v-node for processing may include instructing the CNPPs 508 which check node states to access from state memory 506, to generate c2v messages from the four c-nodes that share edges with the selected v-node. The variable node processor 501 may process the selected v-node based on the input c2v messages via the adders 514, and based on the input LLR data 518 via MUX 516, to generate posterior information and v2c messages. The v2c messages sent back via the v2c permuters 522 may correspond to the same edges and check nodes that sent the c2v messages. The v2c message sent back to a particular check node may include the total posterior information generated by the variable node adders 514, minus the c2v message received from that check node (via the corresponding subtractor 520). For example, each incoming c2v message may be provided to adders 514, as well as to a selected one of subtractors 520. The c2v message will be subtracted from the posterior information, and the resulting v2c message may be used for updating the edge to the corresponding check node. The system microcode may control the order in which various check nodes are selected for sending c2v messages, and via which CNPPs 508 and permuters 510, which in turn may control the order of v-node processing and c-node updating.

The decoder 500 may retain a graph state, corresponding to the states of all check nodes in the graph, in the sign memory 504 and the state memory 506. The sign memory 504 may contain the sign bits of all the edges or v2c messages in the entire graph. The sign of an edge may be in the form of a bit, either a "0" or a "1", depending on what the v-node processor 501 believes the corresponding bit of a v2c message or edge to be, based on available LLR and c2v message information. For example, a graph supporting 32 k-sized code words with degree-4 variable nodes may have 128 k edges, and therefore the sign memory 504 may be large enough to hold 128 k bits. In this example, the sign memory 504 may be implemented as four 32 k-bit memory banks, such that the system 500 can read four vectors per clock cycle (to generate the c2v vectors) and write new information (from the v2c message vectors) into the four banks each clock cycle.

The state memory 506 may contain a compressed state of all the parity sums defined by the entire graph (e.g., including the states of all check nodes of a graph for a 32 k-bit code word). The compressed state of a check node may consist of the total sign (e.g., the sum of all the v2c message sign bits modulus 2 for a given parity sum), the smallest magnitude of v2c messages for a given parity sum ($min_1$), the next smallest magnitude of v2c messages ($min_2$) and the edge index of the graph edge that resulted in the $min_1$ message. The number of words in state memory may equal the maximum number of check node vectors that the decoder 500 can accommodate. In an example embodiment, the state for each check node may be about 20 bits wide. A Z=512 vector decoder processor 500 with a maximum of five check node vectors can store a decoder state as five words of 20*512=10240 bits width, where each word holds the state of a c-node vector. The state memory 506 address for each check node vector may be provided by a micro code memory of the decoder 500. The micro code memory may be, e.g., part of and managed by controller 106 of FIG. 1, or a component of decoder 500.

The state memory 506 may contain two copies of the compressed decoder state. The first may be the final state from the previous iteration, or the "current" state. The check node post processors 508 may use this state to generate c2v messages. The second state, the "partial" state, may be updated by the check node pre-processor 524 based on the content of the received v2c messages. The state copies may be exchanged in the state memory 506 at the end of each iteration.

The one or more check node post-processors 508 may generate all four c2v message vectors for a given variable node in parallel. The parallel message vectors can come from a selection of check node vectors as indicated by four independent addresses (e.g., check node indices) for the state memory 506. The selection of check node vectors used to generate the message vectors may include different check node vectors, or multiple edges from a single check node vector, or a combination thereof. The sign information for each c2v message vector may be obtained by subtracting edge specific sign bit vectors (from the sign memory 504) from the total sign bit information stored in the state memory 506. The magnitude of the output message vectors may be given by min1 unless the edge index of the outgoing messages matches the stored edge index of min1; in this case the magnitude may be set to $min_2$.

The four c2v message vectors may be sent to four programmable permuters 510. A permuter 510 or 522 can receive individual control values from the micro code memory to rearrange or re-order the elements of a message vector, such that the order of elements or messages in each message vector is different between the input and output ports of the permuter.

The variable node processor 501 may receive the four permuted c2v message vectors in parallel, along with input LLR data from the LLR memory or detector 518, which enables the variable node processor 501 to calculate posterior information in parallel. The c2v messages and input LLR information may be processed via a set of adders 514 to generate the posterior information. If the variable node receives c2v messages on multiple cycles (e.g., if the v-node has a degree is greater than 4), then a variable node degree mux (multiplexer) 516 can convert the adder tree (of adder nodes or modules 514) to an accumulator, which can add data from additional c2v messages during a second or subsequent clock cycle. All four v2c messages may also be calculated in parallel, by subtracting c2v message vectors from the posterior information at subtractors 520.

When a read or data decode is first initiated, the state and sign values at the check node processor 502 and sent via the first c2v messages may be set to zero or similar null values, so the initial v2c message may be essentially based on the LLR data alone, whereas relevant information from check nodes may be used in calculation of the posterior information and v2c messages once the check node states have been updated.

The variable node processor 501 may generate a plurality of v2c message vectors per clock cycle. The number of v2c lanes and permuters 522 may correspond to the number of c2v lanes and permuters 510, although not every lane may provide valid information on every clock cycle. The magnitude of the messages may be saturated to reduce the width of the data path, since saturation may have minimal impact on the decoder 500 performance as all messages and the input LLR values 518 may be saturated with identical limits.

Each of the v2c messages may be generated based on the total posterior information from adder array 514, minus a respective c2v message vector for the corresponding check node received during that iteration, via subtractors 520. Each v2c message vector may be permuted, at v2c permuters 522, inverse relative to the c2v permuter 510 corresponding to the subtracted c2v message vector.

The permuted v2c message vectors may be sent to the check node processor 502 for updating the states of the current check node vectors, based on updating the edges by which the selected variable node and the current check nodes are connected. At the check node processor 502, the sign bits of the inverse permuted v2c message vectors may be stored in the sign memory 504 for the current check nodes.

Further, the v2c message vectors may be provided to edge combiner 530. Based on the v2c message vectors, the edge combiner 530 may generate sign information, min1 & $min_2$ magnitude information, and min1 edge indices for all check node state vectors in the state memory 506, which in the example embodiment may be for five check nodes. Accordingly, the edge combiner 530 may have a number of output lines corresponding to the total number of check nodes supported by the check node processor 502, rather than the number of current check nodes being updated via a round of c2v and v2c messages.

In the example embodiment depicted in FIG. 5, there may be four input message vectors but five state vectors, so the edge combiner 530 may direct the message vectors to either, e.g., state vectors 0-3 or 1-4 when there are no multi-edge connections. This selection may be handled by muxes in the edge combiner 530. If more than one v2c message vector is directed to the same check node index (e.g., due to a multi-edge connection between a v-node and a c-node), then the edge combiner 530 may generate appropriate combined values. If a check node index does not receive any messages during a clock cycle, then the min1 and $min_2$ vectors may be set to the maximum positive value and the sign information may be set to '0', which would not change the state of the check node. More information about the edge combiner 530 is discussed in regard to FIG. 6.

The output of the edge combiner 530 may be provided to check node pre-processor 524. The check node pre-processor may update the partial state of each check node state vector at state memory 506 by adding (modulo 2) the sign bit to the total sign information and comparing the new min1 and min2 values with the current values, followed by an update if the new values have smaller magnitudes. The check node pre-processor 524 may not contain memory to store check node states, and may instead use a read-modify-write operation to update the partial state at the state memory 506 for each state based on the combined message received from the edge combiner 530. For example, the state memory 506 may be implemented using flip-flops, which may allow dedicated write "ports" for each of the state vectors, enabling the pre-processor 524 to update all check node state vectors in parallel. The partial state for each check node vector may be initialized as total sign='0', min1 & min2=maximum reliability. As v2c messages are received, the partial states for the current check nodes may be read from state memory 506. The sign bit of the latest v2c message may be XOR'd with the total sign. The message magnitude may be compared with the current min1 & min2 values which may be updated (including edge index 1) as necessary if the message magnitude is smaller than either or both of the min1 & min2 values. At the state memory 506, the partial state may become the new current check node state once v2c messages for all edges of all check nodes have been received.

As discussed above, the variable node processor 501 may generate posterior information for the current variable node using the adder array 514, based on the c2v message vectors and LLR input data from LLR memory 518. The sign bits of the posterior information (e.g., one sign bit for each of the Z bits of the vector) may be sent to a decision memory 526 and a fast convergence checker 528 as a decision vector. The checker 528 can detect convergence as soon as a valid code word has been written into the decision memory 526, which may be as soon as input LLR data 518 has been provided for all variable nodes, provided all the received input data was correct (e.g., containing no errors). Depending on implementation of the convergence checker 528, convergence can be detected at the end of each full iteration (e.g., updating each variable node), or at any point after the first iteration is completed.

An example process flow for reading data from a memory may proceed as follows. The check node post-processors 508 may generate c2v messages based on the current state from the state memory 506 and sign information from the sign memory 504. On a first iteration, the c2v message may contain null data. On subsequent iterations, the sign bits of the output from a check node post-processor 508 may depend on the signs from all the v2c messages received at that check node, except for the signs of the message on the path or edge for which the c2v message is being generated (e.g., for a c2v message vector generated for the edge between c-node 3 and v-node 0, the v2c message vector previously received for that edge is not used to generate the c2v message). The check node post-processor 508 may take the total sign value for the relevant check node stored in the state memory 506, and remove the signs, stored in the sign memory 504, from the v2c message vector that was received along the edge for which a c2v message vector is being generated.

The four c2v message vectors may be sent to the four c2v permuters 510, which may perform pre-determined permutations on the message vectors, and send the resultant messages to the adders 514 at variable node processor 501. Each c2v message vector may also be sent to a corresponding subtractor 520, for use in generating the return v2c message vectors. The adder array 514 may add the input LLR value from the LLR memory or detector 518 to the c2v message vectors to create posterior information. If the variable node will receive c2v inputs over two or more cycles (e.g., if it is greater than degree 4), the output of the adders 514 may be sent to a multiplexor 516, so that the value can be added to any c2v messages received at adders 514 on the next cycle, therefore operating as an accumulator.

At a first iteration, there may be no valid information in the state memory 506 or sign memory 504, so all the generated c2v messages may be set to 0. Therefore, the adders 514 may simply combine 0 vectors with the LLR input, and the initial decision vector and v2c return message vectors may essentially comprise the LLR input symbols. Conforming with the LLR input data 518, decoder 500 may be configured so that the v2c and c2v message vectors may also comprise LLR reliability information, indicating whether the bit is believed to be a 0 or a 1, and how reliable that estimate is. The sign of the value may indicate an estimate on the bit, with positive values corresponding to a "0" bit value, and negative values corresponding to a "1" bit value (or vice-versa, depending on implementation), and the magnitude indicating confidence. Accordingly, the sign memory 504 and state memory 506 may track bit estimates and confidence indicators for nodes and edges. The check node processor 502 may process the sign bit and the reliability information (message magnitude) separately. The additional state information (e.g., min1, min2 and edge index 1) may be used to estimate the reliability of the c2v messages, whereas the sign bit of the c2v message may be calculated by an XOR of the total sign (e.g., the XOR of all sign bits of v2c messages for a given check node) and the sign bit of the v2c message received on the same edge as the edge for which the c2v message is being calculated.

The sign bits of the total posterior information generated from adders 514 may be provided to decision memory 526 and convergence checker 528, while the reliability information may be discarded. The posterior information may also be provided to the subtractors 520, each of which may remove the c2v values from a corresponding check node, to produce v2c messages for each current check node.

The return v2c message vectors may be permuted at permuters 522, with the sign bits stored to sign memory 504. The edge combiner 530 may receive the v2c message vectors, and generate sign information, min1 & min2 magnitude information, and min1 edge indices for all check node state vectors of the graph, which may be more than the number of current check nodes being updated and the number of v2c messages received. If more than one v2c message vector is received for the same check node index, the edge combiner 530 may generate combined values for that check node.

The check node pre-processor 524 may compare the output of the edge combiner 530 with the partial state of the current check nodes from the state memory 506, and update the states as appropriate. When the pre-processor 524 has finished processing the edge combiner outputs for the current set of v2c message vectors, it may update the state for those check nodes at the state memory 506. If convergence of the code word hasn't been determined at the convergence checker 528, the system may continue iterating. Once the entire check node state has been updated, the partial state at memory 506 may be swapped to become the current state, and the partial state may be re-initialized to default values. Further detail may be provided for the edge combiner 530 in regard to FIG. 6, and for the decision memory 526 and fast convergence checker 528 in regard to FIG. 7.

Figure 6:
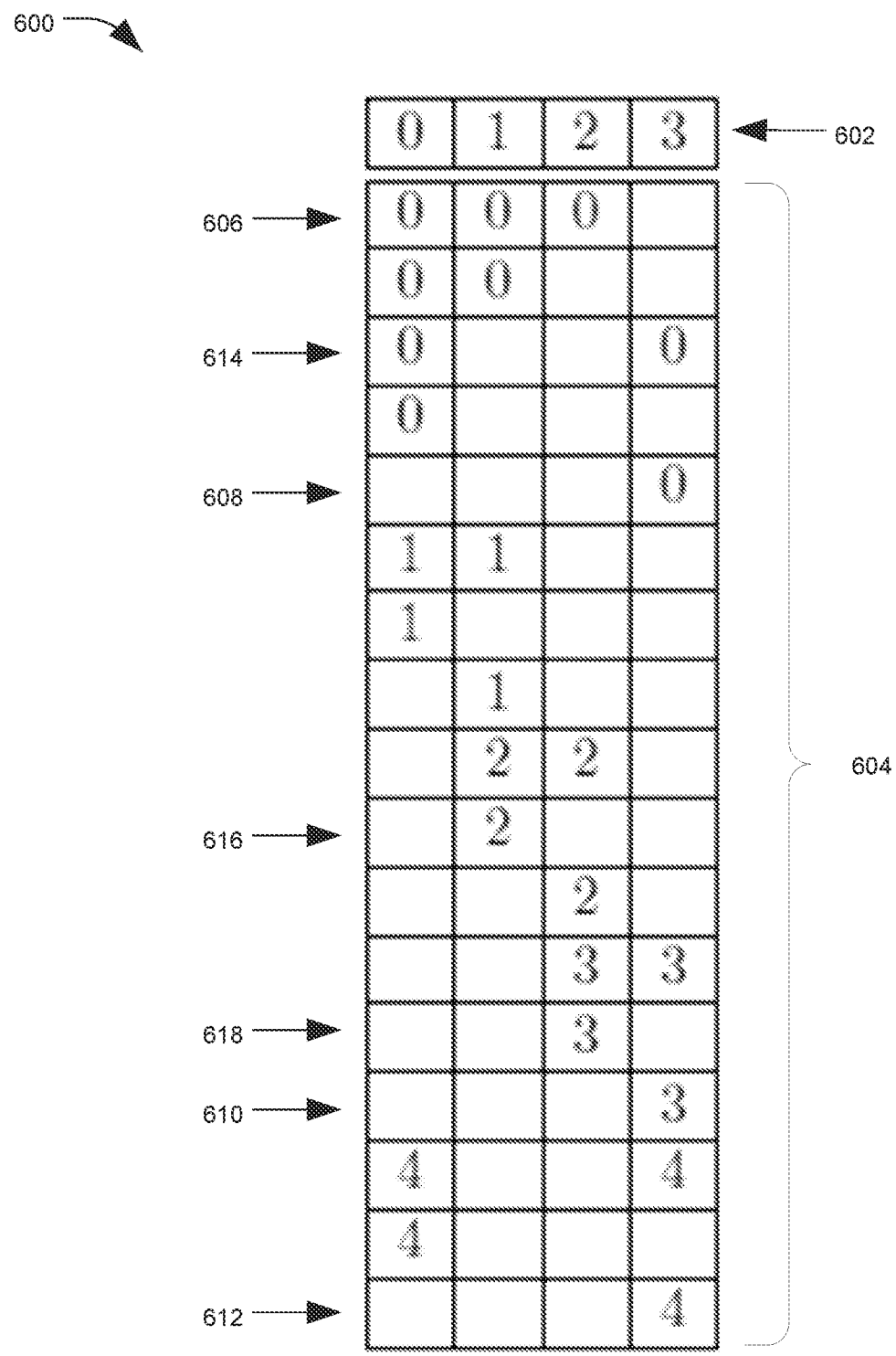
FIG. 6 is a table for a system configured to implement a low latency decoder, in accordance with certain embodiments of the present disclosure.

FIG. 6 is an example table 600 for a system configured to implement a low latency decoder, in accordance with certain embodiments of the present disclosure. In particular, FIG. 6 depicts a table of example permissible connections between data paths and check node indices implemented by an edge combiner 530 of FIG. 5. The table 600 may include a row of input v2c path or permuter indices 602, and the table body may be populated with check node indices 604 that are allowable targets for the corresponding v2c inputs 602. The permuter indices 602 may correspond to the four v2c permuter lines 522 providing inputs to edge combiner 530 in FIG. 5. The check node indices 604 may be numbered 0 to 4, corresponding to the five total check nodes in an example decoder graph, and to the five output lines of edge combiner 530. The table 600 of allowable connections between input permuter lines 602 and check node indices 604 may enable the edge combiner to handle various arrangements of single-edge and multi-edge connections in a decoder graph. The constraints shown in table 600 may be hard coded. The target check node indices 604 for each received input line 602 may be provided by the micro code in each clock cycle. For example, if the micro code provides the set 0,0,0,4 then the edge combiner 530 would combine message vectors from lanes 0-2 and send the results to state 0, and also send the message vector from lane 3 to state 4.

The permuter inputs 602 may each correspond to a received v2c message vector at the edge combiner 530. The column for each permuter input 602 may correspond to a potential check node index 604 being updated by a v2c message vector received at that input 602. Each check node index 604 can receive from zero to three input message vectors at the edge combiner. A check node index 604 that receives zero inputs means it does not receive a v2c message on a given clock cycle, and is not a "current" check node being updated. A check node index 604 that receives one input may receive a single v2c message vector, and may have a single edge being updated on the current clock cycle. A check node index 604 that receives two or three inputs receives a corresponding number of v2c messages, and indicates that the corresponding check node and the selected variable node share at least a 2- or 3-degree multi-edge connection, with those edges being updated simultaneously. Regardless of the number of received v2c messages for a check node index 604, the edge combiner may output a single output message for each check node index. The outputs may be provided to a check node vector pre-processor, which then may update the next decoder state as appropriate.

Based on the design of edge combiner (and the corresponding table 600), not all check node indices 604 can receive the same number of v2c message vectors in parallel in a clock cycle. In the example table 600, only check node index 0 can receive three inputs in a single clock cycle. As shown at row 606, three inputs to check node index 0 can be received at permuter inputs 0, 1, and 2. Note that several lines or rows can be combined if there is no overlap between entries. For example, row 606 does not control the attribution of permuter input 3 in the final column, and accordingly that input could be used in conjunction with any row that only has an index 604 in the final column. Therefore row 606 could be combined with an input for check node index 3 in row 610, or check node index 4 in row 612. In another example, row 614, "0_ _0" could be combined with row 616, "_2_ _", and row 618, "_ _3_", since none of the rows conflict. Conversely, row 606, "0 0 0 _" could not be combined with row 616, "_ 2_ _", as that would result in conflicting attribution of permuter input 1.

The edge combiner 530 may have dedicated logic for combining input message vectors for each state or check node index. This logic may be implemented as an "IF" statement that steps through the combinations shown in table 600, stopping at the combination that matches the check node indices provided by the micro code. For example, state 0 starts at row 606. If that row does not match then it continues to the second row in table 600 and so on. Depending on implementation, this logic may mean that rows 606 and 608 cannot be combined into a degree-4 multi-edge connection for check node index 0. The logic may instead just stop at row 606 for check node index 0 and ignore row 608, thus producing a degree-3 multi-edge connection. Row 606 can be combined with rows 610 or 612 as these two rows are handled by separate logic. The logic referred to above may be executed in parallel, so that "steps" and "stopping" do not imply sequential operation.

The edge combiner can provide sign information by an XOR operation between all messages inputs 602 directed to the same check node 604. If there are no input messages 602 for a particular check node 604, then the output sign bit may be set to 0, which leaves the sign information unchanged. The edge combiner can also extract min1 and min2 information by comparing the magnitudes of all messages 602 directed to the same check node 604. If a check node 604 does not receive any messages 602, then both min1 and min2 may be set to the maximum value; if the check node receives one message, then min2 may be set to the maximum value. To determine the value of $eix_1$ (the edge index of the least reliable message), the edge combiner can use message magnitude comparisons to find the least reliable message. The result of that comparison may be used to select the least reliable message magnitude and its associated edge index as output values.

Figure 7:
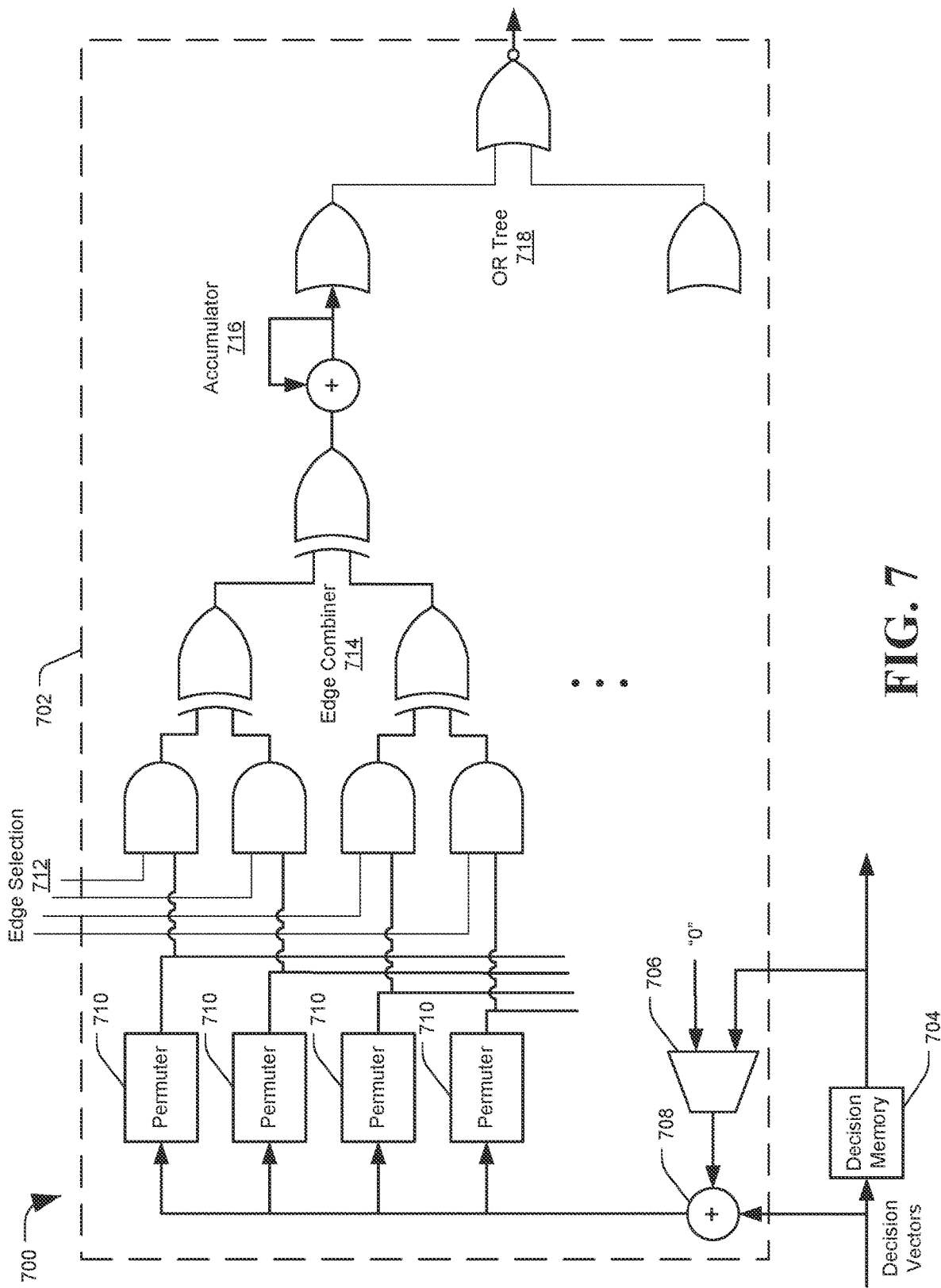
FIG. 7 is a diagram of a system configured to implement a low latency decoder, in accordance with certain embodiments of the present disclosure.

Turning now to FIG. 7, a diagram of a system 700 configured to implement a low latency decoder is shown, in accordance with certain embodiments of the present disclosure. In particular, FIG. 7 depicts an example fast convergence checker 702 and a decision memory 704, such as fast convergence checker 528 and decision memory 526 of FIG. 5, respectively. The fast convergence checker 702 may include an initialization multiplexor (MUX) 706, an adder 708, a plurality of permuters 710, an edge selection module 712, an edge combiner module 714, an accumulator 716, and an OR tree 718.

Some convergence checker designs may use a parity accumulator for each active check node. The accumulator can be reset at the beginning of each iteration and updated with permuted sign bits from the posterior information. If all active parity accumulators contain all-zero vectors at the end of the iteration, then the decoder has converged.

The proposed low latency decoder instead may contain a fast convergence checker 702 as depicted in system 700. This checker 702 can detect convergence at any time after all input data has been read (e.g. after a first full iteration), rather than only detecting convergence at the end of subsequent full iterations. If there are errors in the initial bit estimates, then the fast convergence checker 702 could statistically reduce decode time by one half of full iterations.

The convergence checker 702 can receive decision vectors from the variable node processors. The decision vector of a variable node vector may include the sign bits of the posterior information for the codeword bits of the variable node vector (e.g., 512 bits), and the reliability LLR information may be discarded. The decision vectors may be stored in the decision memory 704.

A modulus 2 vector adder 708 may be used to detect bits that have changed between new and previous decision vectors for a given variable node vector by adding the new vector and the previous vector, via MUX 706, obtained from the decision memory 704. The result may be a vector where a '1' bit indicates a bit that has changed. As a result, the state of the convergence checker 702 does not have to be reset at the beginning of each iteration; the state may always be valid after decision vectors from all variable nodes have been received.

The initial decision vector from a given variable node vector may be added to an all-zero's vector, via the initialization multiplexor 706, such that it is passed unchanged to the permuters 710. The initialization may only occur at the beginning of the decode.

In the depicted example embodiment, four permuters 710 may be used in parallel to provide all message vectors from a degree 4 variable node to the parity accumulators 716. Higher degree variable nodes may be accommodated during an additional clock cycle. The convergence checker permuters 710 may implement a parallel version of the sign bits of the posterior information path. The variable node may send a single decision vector whenever a check node is connected to that variable node. The convergence permuters 710 can generate all four sign bit vectors in parallel rather than sequentially.

There may be one parity accumulator 716 (and an associated edge selection module 712 and edge combiner 714) for each active check node in the graph. The number of permuters 710 may not correlate to the number of check nodes (e.g., it may be four or otherwise correspond to a number of c2v paths in the decoder for simplicity, as there may be four permuter commands from each micro code instruction), and the permuters 710 may be shared among all the accumulators 716. Maximum flexibility in connecting vectors from a given permuter 710 to an accumulator 716 may be achieved by using a AND-XOR network edge combiner 714 enabled by edge selection lines 712, which may be controlled by the decoder micro code. This design allows for multi-edges where two or more vector edges (with different permutation values) connect a variable node to a check node.

The combined edge vectors may be accumulated in one vector accumulator 716 per check node. An OR tree may be used to check for convergence, which may be detected when all active accumulators 716 contain all-zero's vectors. Example methods of applying a low latency decoder as described herein are addressed in the following figures.

Figure 8:
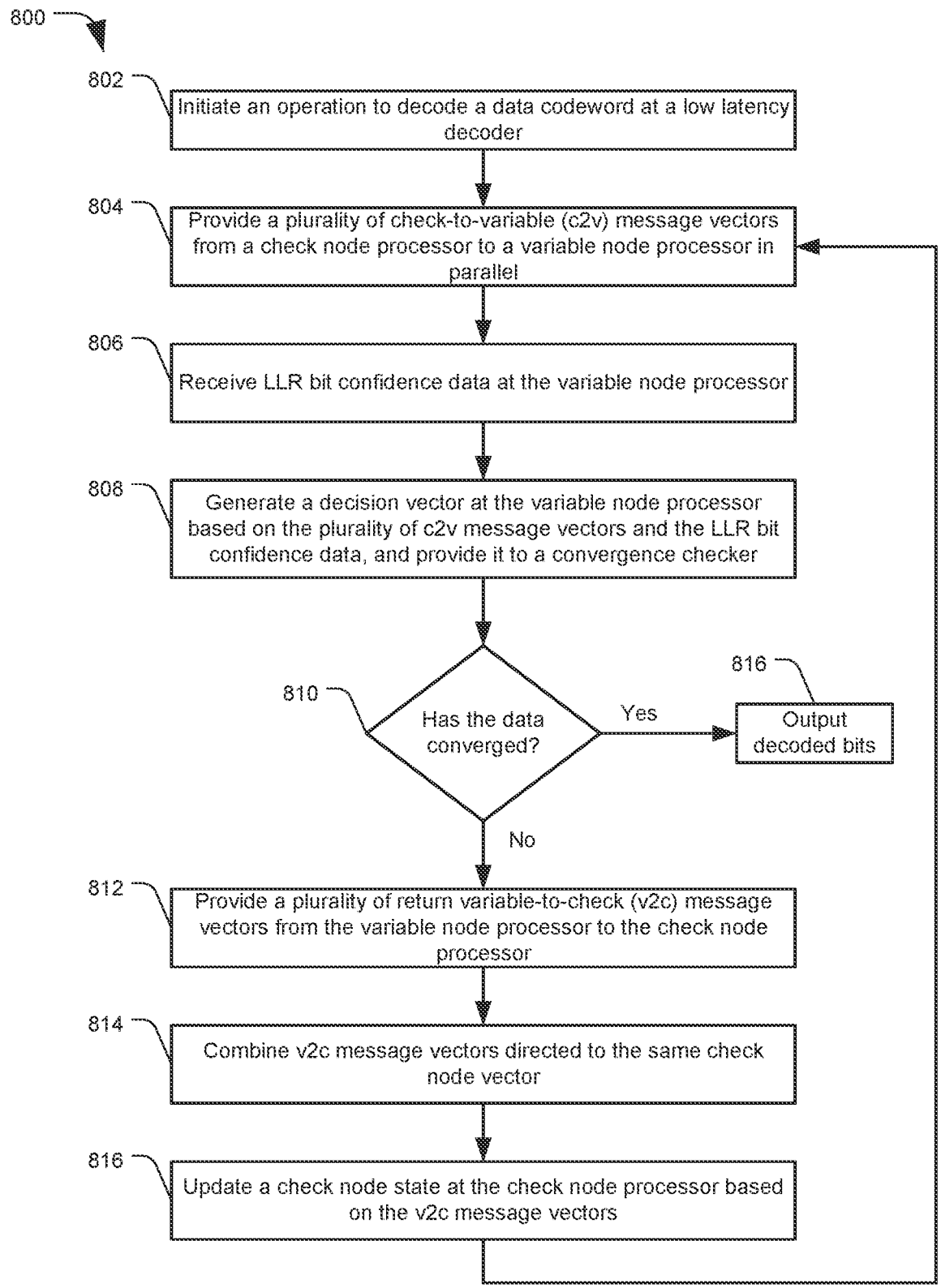
FIG. 8 depicts a flowchart of an example method for implementing a low latency decoder, in accordance with certain embodiments of the present disclosure.

FIG. 8 depicts a flowchart 800 of an example method for implementing a low latency decoder, in accordance with certain embodiments of the present disclosure. In particular, the method may include an example process for applying a decoder, such as a low-density parity check (LDPC) decoder, having high parallelism and low latency. The method may be performed by devices and systems described herein, such as the storage drive of FIG. 1, and the decoder and convergence checker of FIGS. 4, 5, and 7.

The method may include initiating an operation to decode a data codeword at a low latency decoder, at 802. For example, the decoding operation may include a data read operation from a solid state memory device as depicted in FIG. 1, although the disclosure is not limited to such applications. The decoding operation may include LDPC decoding operations based on log likelihood ratio (LLR) confidence values and graphs of variable nodes (v-nodes) and check nodes or constraint nodes (c-nodes), which may be executed via v-node processors and c-node processors. Rather than v- or c-nodes to handle individual bits, the method may include processing v- and c-node vectors, which may process data for large numbers (e.g., "Z") of bits of a codeword grouped together.

The method may include providing a plurality of check-to-variable (c2v) message vectors from a check node processor to a variable node processor in parallel. As depicted in FIGS. 4 and 5, c2v messages may be sent along multiple parallel busses or paths from a c-node processor to a v-node processor in a single clock cycle. Depending on implementation, the parallel c2v message architecture could be used to implement a flooding decoder to process nodes in a variable node-first order. In an example embodiment, the check node processor may send four c2v messages simultaneously (e.g., during a same clock cycle), each from a check node that shares one or more decoder graph edges with a same variable node. So for a degree-4 variable node, the variable node processor may use the four c2v messages to process all edges for the v-node in a single clock cycle. In some embodiments, a variable node having a higher degree than the number of c2v message busses or paths may utilize two or more clock cycles to send additional c2v messages.

At 806, the method may include receiving LLR bit confidence data at the variable node processor. A detector or LLR memory may provide confidence data corresponding to a bit or bits of a variable node or variable node vector being processed by the variable node processor. Based on the bit confidence data and the plurality of c2v messages received by the variable node processor, the method may include generating a decision vector and providing it to a convergence detector, at 808. The decision vector may include a sign bit, representing an estimated value of a bit of the code word, for each of the Z code word bits processed by the variable node vector and represented by the decision vector.

A determination may be made whether the codeword has converged, at 810. If yes, the valid bits of the codeword may be output, and the method may end, at 816. If the codeword hasn't converged, decoding may continue with the variable node processor providing a plurality of return variable-to-check (v2c) message vectors to the check node processor, at 812. The v2c message vectors each may correspond to one of the check nodes that provided the c2v message vectors at 804. The v2c message vector for a given check node may be generated based on the LLR bit confidence data and all the c2v message vectors received at operation 806, minus the c2v message corresponding to the given check node.

When multiple of the v2c message vectors are directed to or correspond to a same check node, the v2c message vectors may be combined, at 814, for example using an edge combiner 530. The process of combining v2c message vectors at an edge combiner is discussed in more detail in regard to FIG. 9. The v2c message vectors, including any combined vectors, may be output for use in updating a check node state for the graph.

At 816, the method may include updating a check node state at the check node processor based on the v2c message vectors. The check node processor may accumulate a partial check node state as edges between variable nodes and check nodes are updated via the v2c messages until all edges have been updated, at which point the partial check node state may become the current check node state used to generate c2v messages in a next iteration. Updating the check node state information may include receiving the v2c message vectors at an edge combiner configured to output state update information for the check nodes in the graph, which may include combining multiple received v2c message vectors directed to the same check node (e.g., due to multi-edge connections between a variable node and check node). A check node pre-processor may be configured to receive the edge combiner output, and compare the state update information for the existing state information for the check nodes in the partial state, and updating any values as appropriate.

After updating the check node state, the method may then return to 804, including providing a next plurality of c2v messages, and repeat until the codeword converges, or in some examples, until the decode operation fails or times out. On different iterations, the check nodes to which the c2v and v2c message vectors correspond may change, and the permuters between the check node processor and variable node processor may be adjusted to alter information sent between the node vectors.

Figure 9:
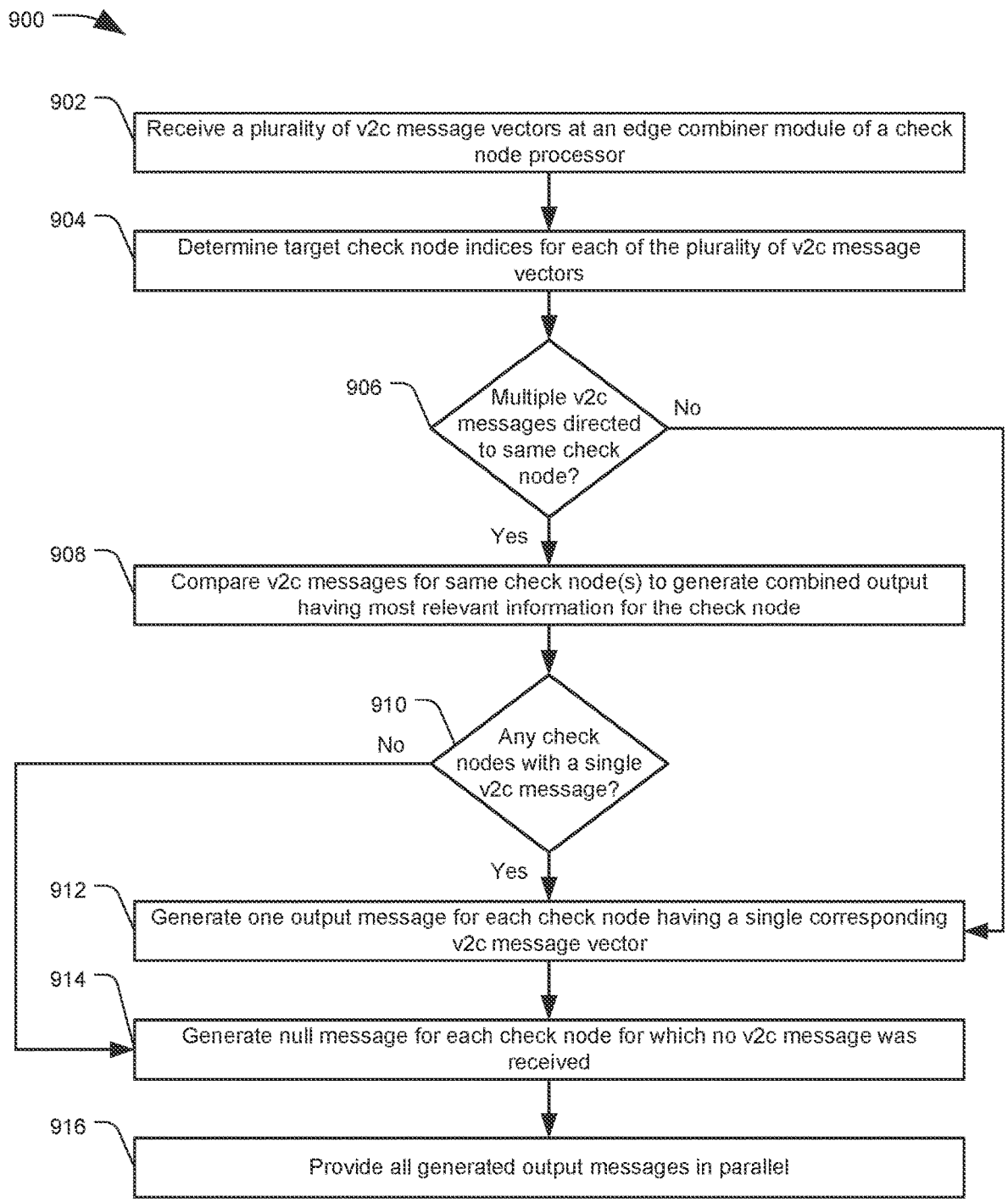
FIG. 9 depicts a flowchart of an example method for implementing a low latency decoder, in accordance with certain embodiments of the present disclosure.

FIG. 9 depicts a flowchart 900 of an example method for implementing a low latency decoder, in accordance with certain embodiments of the present disclosure. In particular, flowchart 900 describes the application of an example edge combiner of a check node processor in a low latency decoder. The method may be performed by devices and systems described herein, such as the storage drive of FIG. 1, and the decoder and edge combiner of FIGS. 4 and 5.

The method may include receiving a plurality of v2c message vectors at an edge combiner module of a check node processor, at 902. The number of input channels for v2c message vectors at the edge combiner may correspond to a selected degree for variable nodes in the graph, such as four channels for a degree-4 variable node, although in some embodiments a v2c message may not be received on every channel or path on every clock cycle or iteration of the decoder. The number of v2c input channels may each correspond to an index, and the number may be lower than a number of outputs of the edge combiner, which may correspond to a number of check nodes in the graph.

At 904, the method may include determining target check node indices for each of the plurality of received v2c message vectors. The target of each v2c message vector may be based on microcode provided to the edge combiner which may route input channels to output channels. The micro code check node index may control the target state for each of the four v2c message lanes. The micro code generator may consider the constraints shown in table 600 when assigning a set of check node indices to the four input message lanes. For example, four received v2c messages may be directed to up to four different check node indices.

A determination may be made whether multiple received v2c message vectors are directed to a same check node, at 906. The edge combiner may be configured to facilitate parallel processing of multi-edge connections between variable nodes and check nodes, and accordingly multiple v2c message vectors may come from a same variable node and be directed to the same check node. If there are not multiple v2c message vectors directed to the same check node, the process flow may continue at operation 912.

However, if there are multiple v2c message vectors directed to the same check node, the method may include comparing data from the multiple v2c message vectors directed to the same check node in order to generate a combined output for the check node having the most relevant information, at 908. For example, the edge combiner may combine information from all of the multiple v2c message vectors to generate a single output including sign information (e.g., based on an XOR of the signs from the multiple v2c message vectors), $min_1$ & $min_2$ magnitude information, and a $min_1$ edge index for the target check node of the multiple v2c message vectors. The combined outputs may be generated for each check node that received multiple input v2c message vectors. For example, two check nodes may each have received two input v2c message vectors.

At 910, a determination may be made whether there are any check node indices in the graph that received a single v2c message vector. For example, if all the input v2c message vectors were involved in multi-edge connections and resulted in combined outputs, there may be no check node that received a single v2c message vector input. If there are no check nodes that received a single v2c message vector input, process flow may continue at 914.

However, if there are any check nodes that received a single v2c message vector input, the method may include generating a single output message for each check node having a corresponding single input v2c message vector, at 912. As with the combined output, the edge combiner may generate an output for each check node including sign information, $min_1$ & $min_2$ magnitude information, and a $min_1$ edge index based on the corresponding input v2c message vector. With only a single input v2c message, the min2 value may be set to a maximum allowed value such that it is unlikely to influence a state of the check node once multiple edges have been processed for that check node.

At 914, the method may include generating a null message for each check node index for which no input v2c message was received. If the edge combiner is configured to provide an output for each check node in the graph on each cycle or iteration, and the number of check nodes in the graph is greater than the number of input v2c channels, then there may always be at least one check node for which no v2c message was received on the current cycle or iteration. If a check node index does not receive any v2c message vectors during a clock cycle, then the $min_1$ and $min_2$ vectors may be set to the maximum positive value and the sign information may be set to '0', which would not change the state of the check node.

The method may include providing all the generated output messages in parallel, at 916. The output messages may include the null message for any check node that did not receive a v2c input message vector from 914, as well as any single v2c-input check node output from 912, and any combined multi-edge output from 908, as appropriate. The outputs may be provided to a check node pre-processor or state memory, such as check node pre-processor 524 or state memory 506 of FIG. 5.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Steps depicted in the flowcharts may optionally be excluded, added, performed in a different order, or performed with different degrees of concurrency than shown (e.g., steps depicted as sequential may be performed concurrently). Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a low density parity check (LDPC) decoder configured decode a codeword of bits, including:
   a variable node processor configured to provide a plurality of variable-to-check (v2c) message vectors to an edge combiner in parallel, the plurality of v2c message vectors including estimates for a selected set of bits of the codeword;
   the edge combiner configured to:
   generate a plurality of output message vectors for a plurality of check node vectors based on the plurality of v2c message vectors;
   provide the plurality of output message vectors to the plurality of check node vectors simultaneously;
   a check node processor configured to update the plurality of check node vectors based on the plurality of output message vectors; and
   a convergence checker circuit configured to detect a valid code word based on bit value estimates from the variable node processor.

2. The apparatus of claim 1 further comprising:
   the edge combiner further configured to:
   determine target check nodes for each of the plurality of v2c message vectors; and
   combine v2c message vectors sharing a same target check node to generate a combined output message vector.

3. The apparatus of claim 2 further comprising:
   an output message vector includes state information for a check node vector, including:
   sign information indicating which of a "0" or "1" value a bit of the codeword is estimated to be;
   a $min_1$ value indicating a first reliability estimate of a least reliable v2c message vector for the check node vector; and
   a $min_1$ value indicating a second reliability estimate of a second least reliable v2c message vector for the check node vector.

4. The apparatus of claim 3 further comprising:
   the edge combiner further configured to generate the plurality of output message vectors to provide an output message vector to each check node vector of the check node processor, including:
   for the combined output message vector:
   XOR a sign bit of v2c message vectors sharing the same target check node to generate the sign information of the combined output message vector;

set the min₁ value and min₁ value based on magnitudes of the v2c message vectors sharing the same target check node;
for a first output vector message generated for a target check node vector of a single v2c message vector:
set the sign information and the min₁ value based on the sign bit and magnitude of the single v2c message vector;
set the min₁ value to a maximum magnitude value;
for a second output vector message generated for a target check node of no v2c message vector from the plurality of v2c message vectors:
set the sign information to a '0' value; and
set the min₁ value and min₁ value to the maximum magnitude value.

5. The apparatus of claim 1 further comprising:
the check node processor further configured to:
generate a plurality of check-to-variable (c2v) message vectors based on the plurality of check node vectors, the plurality of c2v message vectors including estimates for the selected set of bits; and
provide the plurality of c2v message vectors to the variable node processor in parallel.

6. The apparatus of claim 5 further comprising:
the variable node processor further configured to:
receive input data related to a selected set of bits of the codeword, the input data indicating a confidence of the selected set of bits as initially read; and
generate the plurality of v2c message vectors based on the input data and the plurality of c2v message vectors.

7. The apparatus of claim 6 further comprising:
the input data, the plurality of v2c message vectors, and the plurality of c2v message vectors include bit value estimates in the form of log likelihood ratio (LLR) values.

8. The apparatus of claim 6 further comprising:
the LDPC decoder including a circuit configured to decode the codeword based on a graph including:
a plurality of variable node vectors, each configured to determine a bit value and confidence value for a corresponding bit of the codeword;
a plurality of check node vectors, each configured to determine a parity sum for a selected subset of bits of the codeword;
a plurality of edges connecting selected variable node vectors and selected check node vectors; and
the LDPC decoder configured to process the graph via the variable node processor and the check node processor.

9. The apparatus of claim 8 further comprising the LDPC decoder includes a flooding decoder configured to process the graph in a variable node order.

10. A method comprising:
implementing a low density parity check (LDPC) decoder configured to decode a codeword of bits, including:
providing a plurality of variable-to-check (v2c) message vectors from a variable node processor to an edge combiner in parallel, the plurality of v2c message vectors including estimates for a selected set of bits of the codeword;
generating, at the edge combiner, a plurality of output message vectors for a plurality of check node vectors based on the first plurality of v2c message vectors;
providing the plurality of output message vectors from the edge combiner to the plurality of check node vectors simultaneously;
updating the plurality of check node vectors at a check node processor based on the plurality of output message vectors; and
detecting a valid code word at a convergence checker circuit based on bit value estimates from the variable node processor.

11. The method of claim 10 further comprising:
determining target check nodes for each of the plurality of v2c message vectors received at the edge combiner; and
combining, at the edge combiner, v2c message vectors sharing a same target check node to generate a combined output message vector.

12. The method of claim 10 further comprising:
an output message vector includes state information for a check node vector, including:
sign information indicating which of a "0" or "1" value a bit of the codeword is estimated to be;
a min₁ value indicating a first reliability estimate of a least reliable v2c message vector for the check node vector; and
a min₁ value indicating a second reliability estimate of a second least reliable v2c message vector for the check node vector.

13. The method of claim 12 further comprising:
generating the plurality of output message vectors at the edge combiner to provide an output message vector to each check node vector of the check node processor, including:
for a combined output message vector generated for a target check node vector of multiple v2c message vectors:
XOR'ing a sign bit of v2c message vectors sharing the same target check node to generate the sign information of the combined output message vector;
setting the min₁ value and min₁ value based on magnitudes of the v2c message vectors sharing the same target check node;
for a first output vector message generated for a target check node vector of a single v2c message vector:
setting the sign information and the min₁ value based on the sign bit and magnitude of the single v2c message vector;
setting the min₁ value to a maximum magnitude value;
for a second output vector message generated for a target check node of no v2c message vector from the plurality of v2c message vectors:
setting the sign information to a '0' value; and
setting the min₁ value and min₁ value to the maximum magnitude value.

14. The method of claim 10 further comprising:
generating a plurality of check-to-variable (c2v) message vectors at the check node processor based on the plurality of check node vectors, the plurality of c2v message vectors including estimates for the selected set of bits;
providing the plurality of c2v message vectors from the check node processor to the variable node processor in parallel;
receiving input data related to a selected set of bits of the codeword at the variable node processor, the input data indicating a confidence of the selected set of bits as initially read;

generating the plurality of v2c message vectors at the variable node processor based on the input data and the plurality of c2v message vectors; and the input data, the plurality of v2c message vectors, and the plurality of c2v message vectors include bit value estimates in the form of log likelihood ratio (LLR) values.

15. The method of claim 10 further comprising:
decoding the codeword by processing a graph via the variable node processor and the check node processor, the graph including:
  a plurality of variable node vectors, each configured to determine a bit value and confidence value for a corresponding bit of the codeword;
  a plurality of check node vectors, each configured to determine a parity sum for a selected subset of bits of the codeword; and
  a plurality of edges connecting selected variable node vectors and selected check node vectors; and
implementing a flooding decoder via the LDPC decoder, the flooding decoder configured to process the graph in a variable node vector order.

16. A memory device storing instructions that, when executed, cause a processor to perform a method comprising:
  implementing a low density parity check (LDPC) decoder configured decode a codeword of bits, including:
    providing a plurality of variable-to-check (v2c) message vectors from a variable node processor to an edge combiner in parallel, the plurality of v2c message vectors including estimates for a selected set of bits of the codeword;
    generating, at the edge combiner, a plurality of output message vectors for a plurality of check node vectors based on the first plurality of v2c message vectors;
    providing the plurality of output message vectors from the edge combiner to the plurality of check node vectors simultaneously;
    updating the plurality of check node vectors at a check node processor based on the plurality of output message vectors; and
    detecting a valid code word at a convergence checker circuit based on bit value estimates from the variable node processor.

17. The memory device of claim 16 storing instructions that, when executed, cause the processor to perform the method further comprising:
  an output message vector includes state information for a check node vector, including:
    sign information indicating which of a "0" or "1" value a bit of the codeword is estimated to be;
    a $min_1$ value indicating a first reliability estimate of a least reliable v2c message vector for the check node vector; and
    a $min_1$ value indicating a second reliability estimate of a second least reliable v2c message vector for the check node vector.

18. The memory device of claim 17 storing instructions that, when executed, cause the processor to perform the method further comprising:
  generating the plurality of output message vectors at the edge combiner to provide an output message vector to each check node vector of the check node processor, including:
    for a combined output message vector generated for a target check node vector of multiple v2c message vectors:
      XOR'ing a sign bit of v2c message vectors sharing the same target check node to generate the sign information of the combined output message vector;
      setting the $min_1$ value and $min_1$ value based on magnitudes of the v2c message vectors sharing the same target check node;
    for a first output vector message generated for a target check node vector of a single v2c message vector:
      setting the sign information and the $min_1$ value based on the sign bit and magnitude of the single v2c message vector;
      setting the $min_1$ value to a maximum magnitude value;
    for a second output vector message generated for a target check node of no v2c message vector from the plurality of v2c message vectors:
      setting the sign information to a '0' value; and
      setting the $min_1$ value and $min_1$ value to the maximum magnitude value.

19. The memory device of claim 16 storing instructions that, when executed, cause the processor to perform the method further comprising:
  generating a plurality of check-to-variable (c2v) message vectors at the check node processor based on the plurality of check node vectors, the plurality of c2v message vectors including estimates for the selected set of bits;
  providing the plurality of c2v message vectors from the check node processor to the variable node processor in parallel;
  receiving input data related to a selected set of bits of the codeword at the variable node processor, the input data indicating a confidence of the selected set of bits as initially read;
  generating the plurality of v2c message vectors at the variable node processor based on the input data and the plurality of c2v message vectors; and
  the input data, the plurality of v2c message vectors, and the plurality of c2v message vectors include bit value estimates in the form of log likelihood ratio (LLR) values.

20. The memory device of claim 16 storing instructions that, when executed, cause the processor to perform the method further comprising:
  decoding the codeword by processing a graph via the variable node processor and the check node processor, the graph including:
    a plurality of variable node vectors, each configured to determine a bit value and confidence value for a corresponding bit of the codeword;
    a plurality of check node vectors, each configured to determine a parity sum for a selected subset of bits of the codeword; and
    a plurality of edges connecting selected variable node vectors and selected check node vectors; and
  implementing a flooding decoder via the LDPC decoder, the flooding decoder configured to process the graph in a variable node vector order.

* * * * *